United States Patent
Perreau et al.

(10) Patent No.: US 9,959,723 B2
(45) Date of Patent: May 1, 2018

(54) PRODUCT PRESENCE SENSOR SECURITY DEVICE

(71) Applicant: CHECKPOINT SYSTEMS, INC., Thorofare, NJ (US)

(72) Inventors: Benoit Perreau, Weddington, NC (US); David Christianson, Charlotte, NC (US)

(73) Assignee: Checkpoint Systems, Inc., Thorofare, NJ (US)

( * ) Notice: Subject to any disclaimer, the term of this patent is extended or adjusted under 35 U.S.C. 154(b) by 73 days.

(21) Appl. No.: 14/848,709

(22) Filed: Sep. 9, 2015

(65) Prior Publication Data

US 2017/0069186 A1   Mar. 9, 2017

(51) Int. Cl.
  *G08B 13/24* (2006.01)
  *G08B 13/14* (2006.01)
  *H03K 17/955* (2006.01)

(52) U.S. Cl.
  CPC ....... *G08B 13/2431* (2013.01); *G08B 13/149* (2013.01); *H03K 17/955* (2013.01); *H03K 2217/960755* (2013.01); *H03K 2217/960765* (2013.01)

(58) Field of Classification Search
  CPC .. G08B 13/149; G08B 13/14; G08B 13/1436; G08B 13/24
  See application file for complete search history.

(56) References Cited

U.S. PATENT DOCUMENTS

| 4,099,118 | A | 7/1978 | Franklin et al. |
| 6,407,556 | B1* | 6/2002 | Rudeke ............ G08B 13/26 324/663 |
| 2003/0192531 | A1* | 10/2003 | Bachinski ........ F24B 1/191 126/500 |
| 2006/0071774 | A1 | 4/2006 | Brown et al. |
| 2010/0259283 | A1* | 10/2010 | Togura ............. H03K 17/955 324/679 |
| 2013/0162517 | A1* | 6/2013 | Gay ................. G06F 3/046 345/156 |
| 2014/0253290 | A1* | 9/2014 | Yang ............... G06K 7/10188 340/10.1 |
| 2016/0162068 | A1* | 6/2016 | Monney ............ G06F 3/017 345/174 |

FOREIGN PATENT DOCUMENTS

EP  2112476 A1  10/2009
WO  97014335 A1  4/1997

* cited by examiner

*Primary Examiner* — Hongmin Fan
(74) *Attorney, Agent, or Firm* — McNair Law Firm, P.A.

(57) ABSTRACT

A security device is provided including a product presence sensor configured to sense a change in product presence relative to the product presence sensor and a directional element configured to direct the product presence sensor in a sensing direction.

19 Claims, 5 Drawing Sheets

PRODUCT PRESENCE SENSOR SECURITY DEVICE

TECHNICAL FIELD

Example embodiments generally relate to security devices and, in particular, relate to a security device with product sensing capability via, for example, a capacitance sensor.

BACKGROUND

Typical security devices primarily used to prevent or deter theft in retail environments may be configured to be attached to a product or packaging of a product. In some cases, these security devices may include acousto-magnetic or radio frequency tags which can be detected by security gates and trigger an alarm. However, in some instances, these tags may be removed with little to no damage to the product or the product may be removed from the packaging to which the tag is attached, thereby defeating the ability of the tags to detect a theft event.

Other security devices may include a locking lanyard which is wrapped around the product packaging, limiting the ability to open the packaging and remove the product. If the lanyards are cut, in an attempt to gain entry into the packaging to retrieve the contents of the packaging, the security device can sound an audible alarm to alert store personnel of a possible theft. While lanyard security devices are very effective for this purpose, the lanyards can obscure the look of the product packaging and impact the customer's purchasing experience. Further, even with these lanyard security devices, it is still possible, in some instances, to damage the packaging to such a degree the removal of the contents of the product packaging is permitted without setting off an alarm of the security device.

BRIEF SUMMARY OF SOME EXAMPLES

Accordingly, some example embodiments may enable a security device, as described below. In one example embodiment, a security device is provided including a product presence sensor configured to sense a change in product presence relative to the product presence sensor and a directional element configured to direct the product presence sensor in a sensing direction.

In another example embodiment, a method of loss prevention is provided including providing a security device including a product presence sensor configured to sense a change in product presence relative to the product presence sensor and a directional element configured to direct the product presence sensor in a sensing direction; and operably coupling the security device to a product packaging.

BRIEF DESCRIPTION OF THE SEVERAL VIEWS OF THE DRAWING(S)

Reference will now be made to the accompanying drawings, which are not necessarily drawn to scale, and wherein.

DETAILED DESCRIPTION

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout. As used herein, operable coupling should be understood to relate to direct or indirect connection that, in either case, enables functional interconnection of components that are operably coupled to each other.

In some examples embodiments a security device is provided which is configured to sense the presence of a product (e.g., a retail product) within a product packaging, such as based on a change in capacitance. The security device may monitor or sample an electromagnetic field between a capacitance sensor and a ground and sense changes in the electromagnetic field. The security device may include an alarm which may cause an alert in an instance in which a change in capacitance is detected, for example, due to the contents of a product packaging (e.g., the product) being removed. Because the product presence detection capability is based on changes in the electromagnetic field and, in turn, the detected capacitance, the security device does not require a lanyard. Additionally, regardless of the method of opening the product packaging removal of the product may cause a change in capacitance, which may cause the security device to alert.

In some embodiments, the security device may include a backplane shield to limit the capacitance sensor to a desired sensing direction, preventing or limiting the ability of the security device to detect changes in capacitance in undesired or non-sensing directions. In an example embodiment, the security device may additionally or alternatively include a driven shield to control the electromagnetic field of the sensor to limit or eliminate the impact of environmental changes in the non-sensing directions.

In an example embodiment, the alarm may cause different alerts based on measured changes in the magnitude of the product presence, e.g., capacitance. The different alerts may be utilized to determine a high (e.g., more than a threshold) capacitance position on the product packaging. In some embodiments, a maximum field interaction location may be identified by moving the security device about the product packaging to determine an optimal placement of the security device on the product packaging. The security device may be configured to provide audible tones at a frequency or volume proportional to the magnitude of the capacitance in order to provide the user feedback on optimal placement. As such, the security device may be placed on the product packaging based on a high capacitance position, e.g., on or near the high capacitance position.

In some example embodiments, the security device may include a motion sensor configured to determine if the security device and product packaging to which it is attached are stationary or in motion. The capacitance sensor of the security device may begin to sense the electromagnetic field in response to a motion detection, which may prolong the battery life of the security device, since it may not be continuously monitoring for product presence. In other words, the capacitance sensor may go into a sleep mode, for example after a time out period, where the sensor is not active and does not sense or monitor the presence of the product within the product packaging. The capacitance sensor may transition to an active mode in response to the detection of motion by the motion sensor.

In an example embodiment, the security device may include processing circuitry configured to determine whether the change in capacitance satisfies a predetermined change threshold. The security device may alert in response to the processing circuitry determining that the change in capacitance satisfies the predetermined change threshold indicative of the product, or a portion of the product, being removed from the packaging. Use of the predetermined change threshold may limit or prevent false alerts based on a product shifting in a packaging, or noise that might affect the monitored capacitance.

Figure 1:
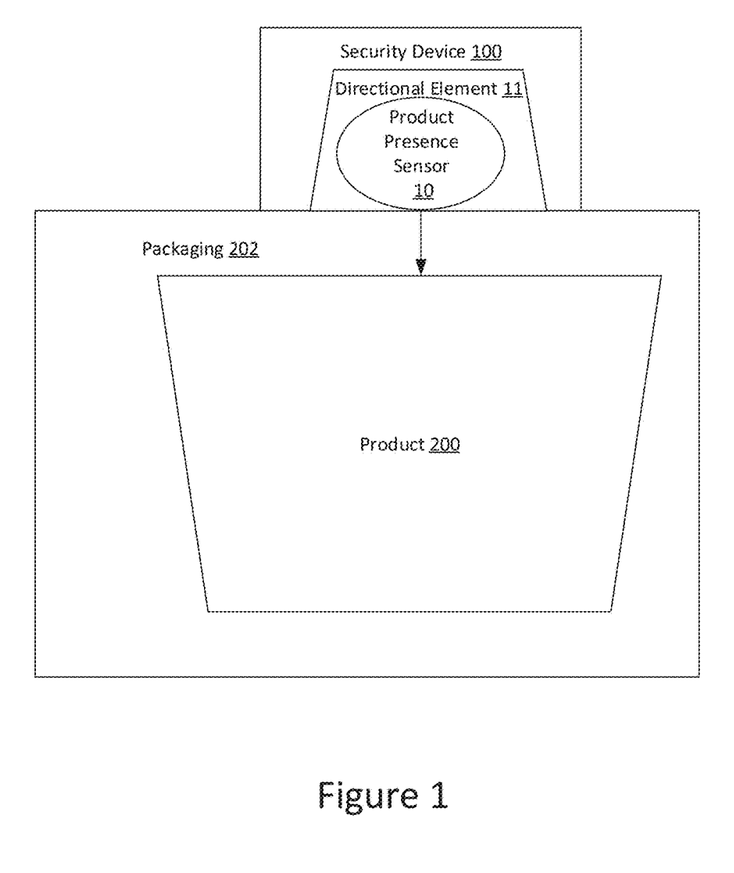
FIG. 1 illustrates an example security device according to an example embodiment.

FIG. 1 illustrates a security device according to an example embodiment. The security device 100 may be attached or affixed to packaging 202 containing a product 200. The security device 100 may be operably coupled to the packaging 202 by a coupling, such as an adhesive, hooks, tab locks, lockable posts, or the like. The security device 100 may include a product presence sensor 10, which may include a capacitance sensor, configured to detect a change in product presence, for example, when the product 200 is removed from the packaging 202. In an example embodiment, the change in product presence may be a determined based on a change in capacitance as indicated by the electromagnetic field between the capacitance sensor and, for example, a ground ring. The security device 100 may also include a directional element 11, such as a backplane shield, configured to limit or control the sensing direction of the product presence sensor 10.

In an example embodiment, the security device 100 may be configured to detect changes in the electromagnetic field, by a product 2.5 mm, 5 mm, 10 mm, 50 mm, or the like from the capacitance sensor. The security device 100 may configured to detect changes in the electromagnetic field through packaging 202 including cardboard, paper, plastic, textiles, or the like.

Figure 2A:
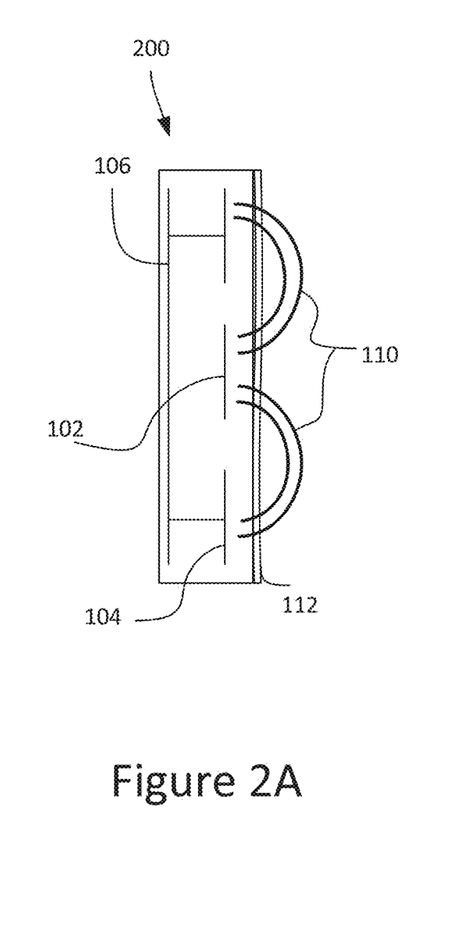
FIGS. 2A and 2B illustrate example cross-sectional views of security devices according to example embodiments.
Figure 2B:
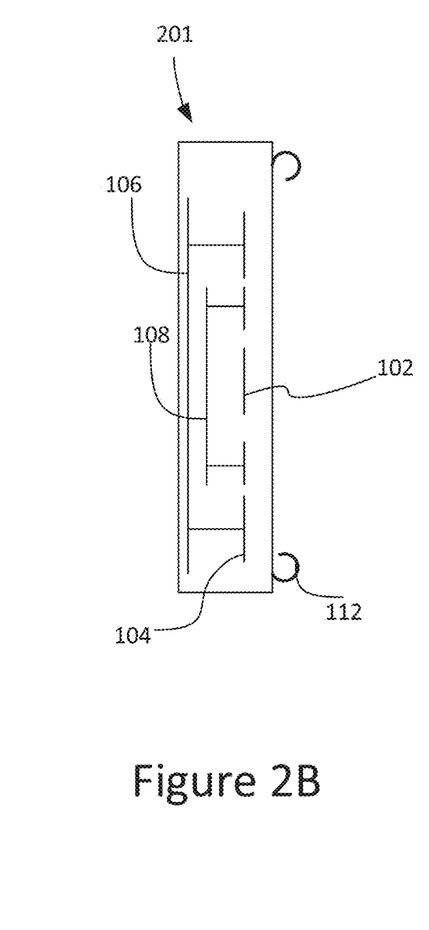

FIGS. 2A and 2B illustrate cross-sectional views of some example sensing assemblies of security devices according to example embodiments. In the embodiment depicted in FIG. 2A, the sensing assembly 200 may include capacitance sensor 102 and a ground ring 104, where the capacitance sensor 102 is disposed within the ground ring 104. The capacitance sensor 102 and the ground ring 104 may be disposed in common plane with the capacitance sensor 102, i.e., a sensor plane. The capacitance sensor 102 may be an etched copper, copper foil, indium tin foil, printed ink, aluminum or other metal trace on a circuit board, or the like. The ground ring 104 may be copper foil, indium foil, aluminum or other metal trace on a circuit board, or the like. An electromagnetic field 110 may be induced between the capacitance sensor 102 and the ground ring 104. Sensing circuitry, for example, including a processor, operably coupled to the capacitance sensor 102 may sense changes in the electromagnetic field 110 detected by the capacitance sensor 102 due to objects interacting with the electromagnetic field 110, such as moving in the area perpendicular to or adjacent to the sensor plane. In an example embodiment, an increase in the capacitance associated with the electromagnetic field 110 may be indicative of an object entering the area perpendicular to the sensor plane. Similarly, a decrease in capacitance associated with the electromagnetic field 110 may be indicative of an object moving out of the area proximate and perpendicular to the sensor plane.

In an example embodiment, the sensing assembly may include a directional element in the form of a backplane shield 106. The backplane shield 106 may include copper foil, indium foil, aluminum or other metal trace on a circuit board, or the like, disposed in a backplane shield plane that is substantially parallel to the sensor plane. An air gap may be provided between the sensor plane and the backplane shield plane. In some example embodiments, the backplane shield 106 may be substantially the same diameter as the ground ring 104. The backplane shield 106 may be electrically connected, e.g. shorted, to the ground ring 104. The backplane shield 106 may direct or control the electromagnetic field 110 and therefore capacitance sensing, toward the side of the capacitance sensor 102 opposite the backplane shield 106.

The security device 100 may include, a coupling 112 configured to operably couple the security device 100 to a product packaging 202. The coupling 112 may be an adhesive (as indicated in FIG. 2A), a magnet, hooks (as indicated in FIG. 2B), tab locks, lockable posts, or the like. In some example embodiments, the coupling 112 may include a separate locking disc or plate that is adhered to the packaging, which can receive the security device 100 and be releasably locked to the disc or plate through the use of a key, e.g., a magnetic key.

In the example embodiment depicted in FIG. 2B, the sensing assembly 201 may additionally include a driven shield 108 disposed between the backplane shield 106 and the capacitance sensor 102. The driven shield 108 may operate as a component of the directional element. For example, the capacitance sensor 102 may be disposed within the driven shield 108 and the ground ring 104 and backplane shield 106 are disposed external to the driven shield 108. The driven shield 108 may include a copper foil, indium foil, or the like. The driven shield 108 may include a first portion disposed in the sensor plane between the capacitance sensor 102, and ground ring 104. A second portion of the driven shield 108 may be disposed substantially parallel with the sensor plane, and may take the form of a ring encircling the capacitance sensor 102. The driven shield 108 may be an electrical shield configured to protect the capacitance sensor 102 from leakage current, which may cause error in the measurement or functionality of the capacitance sensor 102. In some embodiments, the driven shield 108 may include a voltage buffer/follower configured to match the driven shield voltage to the capacitance sensor voltage, to prevent current flow and/or capacitive effects between the capacitance sensor 102 and the ground ring 104 and/or the backplane shield 106.

In some embodiments, the security device 100 may be a two part device, including a label such as a foil label or electronic article surveillance (EAS) label, which may include a portion of the sensing assembly, such as the capacitance sensor 102 and ground ring 104, the backplane shield 106, the driven shield 108, or the like.

Figure 3:
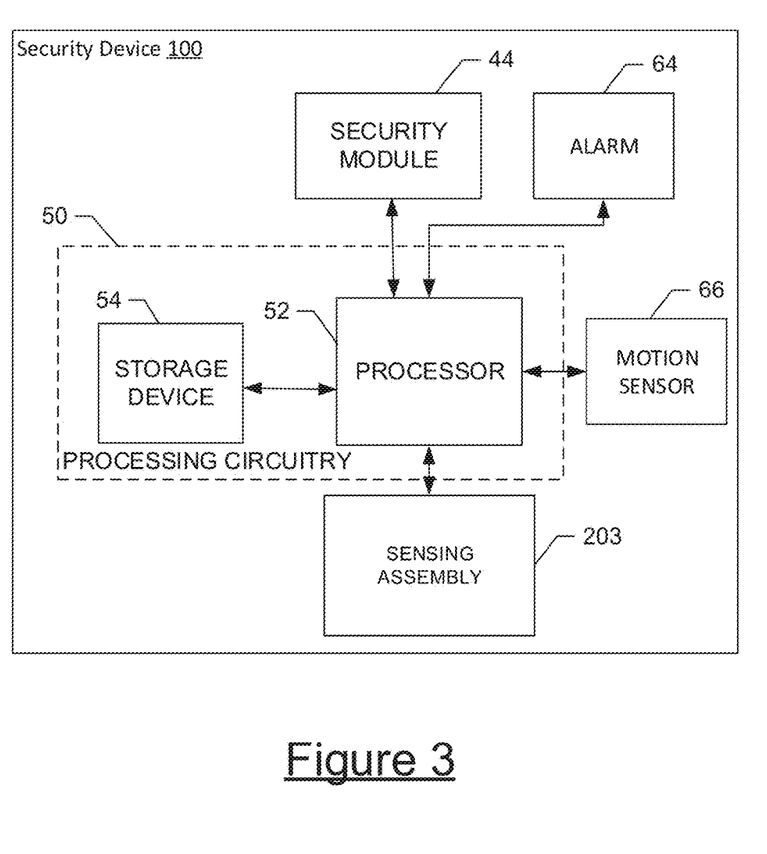
FIG. 3 illustrates an example block diagram of a security device according to an example embodiment.

FIG. 3 illustrates a block diagram of the security device 100 according to an example embodiment. The security device 100 may include processing circuitry 50 and sensing assembly 203. Examples of sensing assembly 203 include sensing assemblies 200 and 201, but more generally sensing assembly 203 may include a capacitance sensor 102 and a ground 104. In one embodiment, the processing circuitry 50 may include a storage device 54 and a processor 52 that may be in communication with or otherwise control security module 44, an alarm 64, a motion sensor 66, sensing assembly 203, or the like. As such, the processing circuitry 50 may be embodied as a circuit chip (e.g. an integrated circuit chip) configured (e.g. with hardware, software or a combination of hardware and software) to perform operations described herein.

In an example embodiment, the storage device 54 may include one or more non-transitory storage or memory devices such as, for example, volatile and/or non-volatile memory that may be either fixed or removable. The storage device 54 may be configured to store information, data, applications, instructions or the like for enabling the apparatus to carry out various functions in accordance with example embodiments. For example, the storage device 54 could be configured to buffer input data for processing by the processor 52. Additionally or alternatively, the storage device 54 could be configured to store instructions for execution by the processor 52, such as instructions for controlling the sensing assembly 203 as described herein.

The processor 52 may be embodied in a number of different ways. For example, the processor 52 may be embodied as various processing means such as a microprocessor or other processing element, a coprocessor, a controller or various other computing or processing devices including integrated circuits such as, for example, an ASIC (application specific integrated circuit), an FPGA (field programmable gate array), a hardware accelerator, or the like. In an example embodiment, the processor 52 may be configured to execute instructions stored in the storage device 54 or otherwise accessible to the processor 52. As such, whether configured by hardware or software methods, or by a combination thereof, the processor 52 may represent an entity (e.g. physically embodied in circuitry) capable of performing operations according to embodiments while configured accordingly. Thus, for example, when the processor 52 is embodied as an ASIC, FPGA or the like, the processor 52 may be specifically configured hardware for conducting the operations described herein. Alternatively, as another example, when the processor 52 is embodied as an executor of software instructions, the instructions may specifically configure the processor 52 to perform the operations described herein.

According to some example embodiments, the security module 44 may be instructions configured to control the processing circuitry 50 to perform functionalities associated with detecting the presence or absence of a product 200 within product packaging 202. According to some example embodiments, the security module 44 may be embodied in the processing circuitry 50, e.g., the storage device 54 or the processor 52, as further described below. The processing circuitry 50 may sample the electromagnetic field detected by the sensing assembly 203, and more specifically the capacitance sensor 102, periodically, such as 1 time per second, 5 times a second, 10 times a second, or the like. In some example embodiments, the security module 44 may cause the processing circuitry 50, to filter the samples, such as by averaging, outlier removal, or the like. In some example embodiments, the processing circuitry 50 may utilize an application program interface for monitoring or sampling the capacitance sensor 102 and/or filtering of the samples.

The alarm 64 may be configured to generate sound, light, or the like, to attract attention to the location of the security device 100. The alarm 64 may include a speaker and/or lights. The processing circuitry 50 may be configured to cause the alarm to alert, e.g. sound and/or illuminate, in an instance in which the processing circuitry 50 detects a change in the electromagnetic field between the capacitance sensor 102 and ground. In some embodiments, the alarm 64 may be caused to alert in an instance in which the processing circuitry 50 determines that a change in capacitance satisfies a predetermined change threshold indicating that a product 200 is being removed from the packaging 202. In an example embodiment the alarm 64 may be configured to locally alert, transmit a signal to a remote alarm system to cause or trigger the alert, such as a gate alarm, or store alarm.

In an example embodiment, the processing circuitry 50 may determine if the change in capacitance satisfies a predetermined change threshold, e.g., a step change in capacitance. In an instance in which the change in capacitance satisfies the predetermined change threshold, the processing circuitry 50 may cause the alarm 64 to alert locally and/or remotely. Further in some example embodiments, the processing circuitry 50 may undertake an initialization process with respect to the packaging to which the security device 100 is being applied. In this regard, the initialization process may include the processing circuitry 50 obtaining a series of sample values of the capacitance or product presence and average those values over time. If a deviation of the next sample is within a predetermined range of the average value after taking an average of a minimum number of samples, then the initialization process may be complete and a baseline setting for the capacitance or product presence can be set at the determined average value. After the baseline value is set, the processing circuitry 50 may begin monitoring the capacitance or product presence values and compare these values to a lower offset threshold. In this regard, the processing circuitry 50 may determine if a sample of the sensed capacitance value is less than minimum threshold that is set based upon a predetermined offset from the average value. If the sample value is less than the average value minus the minimum offset, i.e., the minimum threshold, then the processing circuitry 50 may drive the alarm 64 to sound indicating that the product has been removed from the packaging. In some example embodiments, rather than using a static offset from the average value as the threshold to sound the alarm 64, a dynamic offset may be used that is a function of the determined average value. In this regard, the dynamic offset threshold may be proportional to the magnitude of the average value.

In some embodiments, the processing circuitry 50 may cause the alarm 64 to cause different alerts, e.g. different sounds, such as volume, pitch, frequency, tone, tone sequence, or the like, different illuminations, such as number of lights, color of lights, pattern of lights, or the like, based on the change in magnitude of the sensed capacitance, for example a higher capacitance may be indicative of an object being closer to the capacitance sensor 102 than a lower capacitance. In some embodiments, a high capacitance position of the product packaging 202 may be determined based on the different alerts.

In some embodiments, the motion sensor 66 may be provided. The motion sensor 66 may be a jiggle switch, accelerometer, or the like, configured to determine motion of the security device 100. The processing circuitry 50 may be configured to begin monitoring or sampling the electromagnetic field via the capacitance sensor 102 in an instance in which the motion sensor 66 detects or determines the security device 100 is in motion. The processing circuitry 50 may be further configured to cease sampling or monitoring the electromagnetic field via the capacitance sensor 102, in an instance in which the motion sensor 66 detects or determines that no motion of the security device has occurred for a threshold duration of time. As such, in some example embodiments, the security device 100 may continue sampling and/or monitoring the electromagnetic field for a predetermined period of time after the detection of motion or cessation of motion, such as 5 seconds, 10, seconds, 30 seconds, or the like. Limiting monitoring and/or sampling of the electromagnetic field during motion of the security device 100 may extend the battery life of the security device 100.

In an example embodiment, the security module 44 may be configured causing the processing circuitry 50 to monitor or sample the electromagnetic field via the capacitance sensor 102 and cause the alarm 64 to alert based on a change in capacitance.

In some embodiments, the security module 44 may further include one or more components or modules that may be individually configured to perform one or more of the individual tasks or functions generally attributable to the security module 44. However, the security module 44 need not necessarily be modular. In cases where the security module 44 employs modules, the modules may, for example, be configured for causing an alert based on a change in capacitance, as described herein. In some embodiments, the security module 44 and/or any modules comprising the security module 44 may be any means such as a device or circuitry operating in accordance with software or otherwise embodied in hardware or a combination of hardware and software (e.g. processor 52 operating under software control, the processor 52 embodied as an ASIC or FPGA specifically configured to perform the operations described herein, or a combination thereof) thereby configuring the device or circuitry to perform the corresponding functions of the security module 44 and/or any modules thereof, as described herein.

The security module 44 described above may be used to support some or all of the operations described herein. It will be understood that operations of the security device 100 and/or the security module 44, may be implemented by various means, such as hardware, firmware, processor, circuitry and/or other device associated with execution of software including one or more computer program instructions. For example, one or more of the procedures described herein may be embodied by computer program instructions. In this regard, the computer program instructions which embody the procedures described above may be stored by a memory device of a security device 100.

Figure 4:
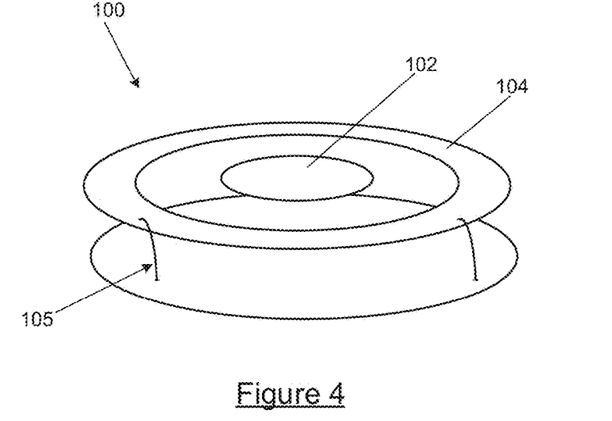
FIGS. 4 and 5 illustrate example embodiments of a security device internal to a housing according to an example embodiment.
Figure 5:
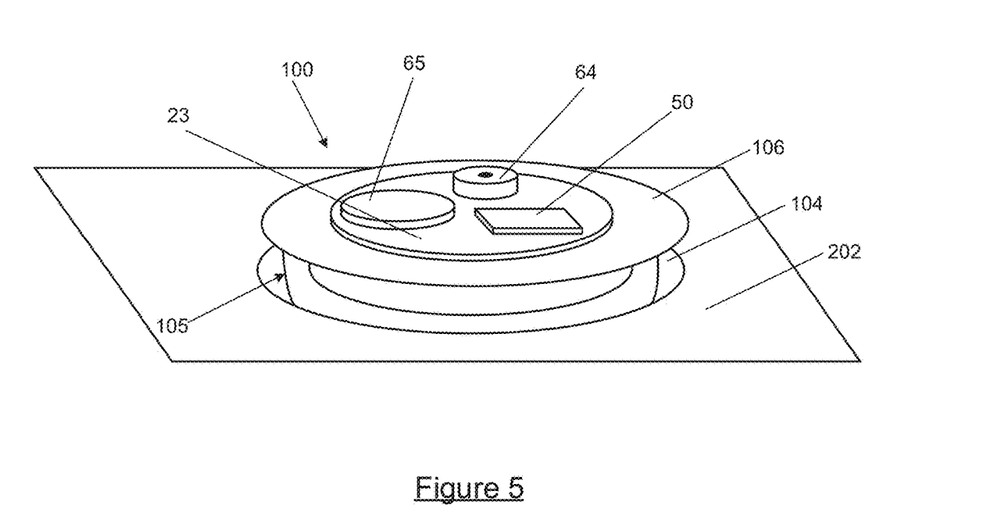

FIGS. 4 and 5 illustrate example embodiments of components of a security device from an internal 3 dimensional perspective. The components depicted in FIGS. 4 and 5 are substantially similar to those of the security device 100 described in FIG. 2A. FIG. 4 is a view of the capacitance sensor side of the security device 100. The capacitance sensor 102, for example including a copper foil circle, is disposed on an inner surface of a housing (not depicted) of the security device 100. The ground ring 104, for example including a copper foil ring, is disposed around the capacitance sensor 102 on the interior surface of the security device 100. The capacitance sensor 102 and ground ring 104 disposed on the interior surface of the security device 100 may be in a common sensor plane with a gap between the capacitance sensor 102 and the ground ring 104. The backplane shield 106 may be disposed in the backplane shield plane substantially parallel with the sensor plane, but separated by an air gap between the backplane shield plane and the sensor plane. Connectors 105 may be included to electrically connect the backplane shield 106 to the ground ring 104 and may be formed of copper wire or the link. The backplane shield 106 may include a foil circle of substantially the same diameter as the ground ring 104

FIG. 5 depicts a perspective view of the security device 100 disposed above and in relation to product packaging 202. The processing circuitry 50 is disposed on a circuit board 23 on the upper portion of the security device 100 proximate the backplane shield 106 opposite the sensor plane. The alarm 64 and a battery 65 are disposed proximate the processing circuitry 50 and also affixed to the circuit board 23. The sensor plane side of the security device 100 may be operably coupled to the product packaging 202.

Figure 6:
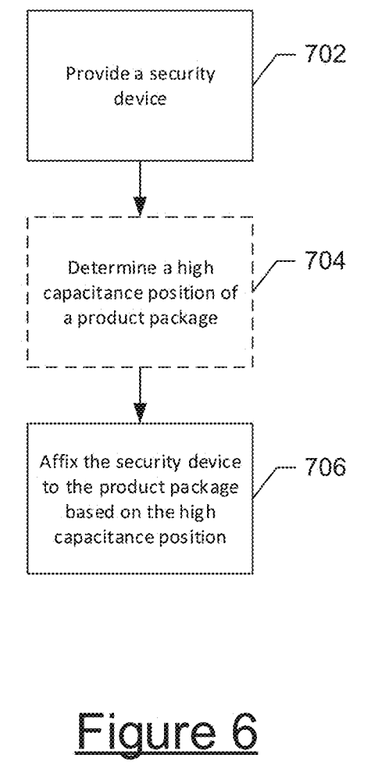
FIG. 6 illustrates an example flowchart of a method of loss prevention according to an example embodiment.

FIG. 6 illustrates an example flowchart of the method of loss prevention according to an example embodiment.

At operation 702, a security device, such as security device 100 may be provided, the security device 100, may include a ground ring 104, a capacitance sensor 102 disposed within the ground ring 104 configured to sense an electromagnetic field established between the capacitance sensor 102 and the ground ring 104, and an alarm 64 configured to cause an alert based on a change in capacitance.

In some example embodiments, the security device 100 may include the alarm 64 configured to cause different alerts based on a capacitance magnitude or change thereof.

At operation 704, a high capacitance (threshold) position may be determined, in an instance in which the security device 100 is configured with the alarm 64 to cause different alerts based on the capacitance magnitude. The security device 100 may be placed on a product packaging 202 containing the product 200. The security device 100 may be moved to different portions of the packaging 202, while monitoring the change in capacitance, e.g., the different alerts. A high capacitance position may be the area of the packaging 202 with the highest sensed capacitance and which is accessible to the security device 100, for example areas including corners and edges which the security device 100 would extend beyond may not be considered accessible. The high capacitance position, or an area proximate to the high capacitance position may be logged, recorded for instructional purposes, or the packaging 202 may be marked.

At operation 706, the security device 100 may be operably coupled to the packaging 202. The security device 100 may be operably coupled to the packaging 202 via one or more couplings 112, such as adhesive, hooks, tab locks, lockable posts, or the like. The security device 100 may be placed at any convenient place on the packaging 202. In an example embodiment, the security device 100 may be placed in a position which is substantially centered on a side of the packaging 202. In an example embodiment, a coupling position is indicated on the packaging 202 based on capacitance testing or a determination of a high capacitance position. In some embodiments the coupling position may be at the location of the highest capacitance. Alternatively, the coupling position may be proximate to the high capacitance position, such as when the packaging material would interfere with capacitance sensor 102 at the high capacitance position.

The security device 100 may monitor or sample the electromagnetic field of the capacitance sensor 102. The security device 100 alarm 64 may cause an alert based on a change in capacitance, indicative of a product 200, being removed from the packaging 202.

In some embodiments, the security device may be further configured for optional modifications. In this regard, in an example embodiment the product presence sensor includes a ground and a capacitance sensor configured to sense an electromagnetic field established between the capacitance sensor and the ground. A change in capacitance between the capacitance sensor and the ground is indicative of a change in product presence. In some example embodiment, the ground is shaped as a ground ring and the capacitance sensor is disposed within the ground ring and the product presence sensor also includes a driven shield disposed between the ground ring and the capacitance sensor. In an example embodiment, the security device includes driven shield disposed between the capacitance sensor and the ground ring and the directional element. In some example embodiments, the security device includes an alarm configured to cause an alert based on a sensed change in product presence. In an example embodiment, the alarm causes different alerts based on a change in the product presence magnitude. In some example embodiments, the directional element comprises a backplane shield. In an example embodiment, the security device is configured to be operably coupled to a product packaging. In some example embodiments, the security device includes a motion sensor configured to detect motion of the security device and the product presence sensor is configured to sense a presence of a product in response to detecting motion of the security device. In an example embodiment, the method also includes determining a high product presence position on the product packaging based on the different alerts, and the operably coupling the security device is based on the high product presence position.

Many modifications and other embodiments of the security device set forth herein will come to mind to one skilled in the art to which these embodiments pertain having the benefit of the teachings presented in the foregoing descriptions and the associated drawings. Therefore, it is to be understood that the security devices are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

That which is claimed:

1. A security device comprising:
   an attachment coupling configured to attach the security device to product packaging, the product packaging having a product disposed therein;
   a product presence sensor configured to sense a change in product presence within the product packaging, the change in product presence being relative to the product presence sensor and indicative of an occurrence of a product being removed from the product packaging, the product presence sensor comprising:
      a capacitance sensor, and
      a driven shield; and
   a directional element configured to direct the product presence sensor in a sensing direction;
   wherein a first portion of the driven shield is disposed on a common plane with the capacitance sensor and a second portion, that is electrically connected to the first portion, of the driven shield is disposed in a plane between the capacitance sensor and the directional element and parallel to the common plane.

2. The security device of claim 1, wherein the product presence sensor further comprises a ground, wherein a change in capacitance detected by the capacitance sensor is indicative of a change in product presence.

3. The security device of claim 2, wherein the ground is shaped as a ground ring and the capacitance sensor is disposed within the ground ring.

4. The security device of claim 2, wherein the ground is shaped as a ground ring and the capacitance sensor is disposed within the ground ring.

5. The security device of claim 1 further comprising:
   an alarm configured to cause an alert based on a sensed change in product presence.

6. The security device of claim 5, wherein the alarm causes different alerts based on a change in the product presence magnitude.

7. The security device of claim 1, wherein the directional element comprises a backplane shield.

8. The security device of claim 1, further comprising:
   a motion sensor configured to detect motion of the security device and transition the security device from a sleep mode to an active mode in response to detecting motion of the security device, wherein, in the active mode, the product presence sensor is configured to sense a presence of a product and wherein security device is further configured to cease sensing the presence of the product in the active mode in response to a detection of no motion by the motion sensor for a threshold duration of time.

9. The security device of claim 1, further comprising:
   an alarm; and
   processing circuitry configured to:
      determine if the change in product presence satisfies a predetermined change threshold, and
      cause an alert by generating an audible sound via the alarm in response to the change in product presence satisfying the predetermined change threshold.

10. A method of loss prevention comprising:
    providing a security device comprising:
       an attachment coupling configured to attach the security device to product packaging, the product packaging having a product disposed therein;
       a product presence sensor configured to sense a change in product presence within the product packaging, the change in product presence being relative to the product presence sensor and indicative of an occurrence of a product being removed from the product packaging, the product presence sensor comprising:
          a capacitance sensor, and
          a driven shield; and
       a directional element configured to direct the product presence sensor in a sensing direction,
       wherein a first portion of the driven shield is disposed on a common plane with the capacitance sensor and a second portion of the driven shield, that is electrically connected to the first portion, is disposed between the capacitance sensor and the directional element in a plane parallel to the common plane; and attaching the security device to product packaging via an attachment coupling.

11. The method of claim 10, wherein the product presence sensor comprises:
   a ground, wherein a change in capacitance detected by the capacitance sensor is indicative of the change in product presence.

12. The method of claim 11, wherein the ground is shaped as a ground ring and the capacitance sensor is disposed within the ground ring.

13. The method of claim 12, wherein a portion of the driven shield is disposed between the capacitance sensor and the ground ring.

14. The method of claim 10, wherein the security device further comprises:
   an alarm configured to cause an alert based on a change in product presence magnitude.

15. The method of claim 14, wherein the alarm is configured to cause different alerts based on a change in product presence magnitude.

16. The method of claim 15 further comprising:
   determining a high product presence position on the product packaging based on the different alerts, and
   wherein the attaching the security device is based on the high product presence position.

17. The method of claim 10, wherein the directional element comprises a backplane.

18. The method of claim 10, wherein the security device further comprises:
   a motion sensor configured to determine motion of the security device and transition the security device from a sleep mode to an active mode in response to detecting motion of the security device,
   wherein, in the active mode, the product presence sensor is configured to sense the product presence and wherein security device is further configured to cease sensing the presence of the product in the active mode in response to a detection of no motion by the motion sensor for a threshold duration of time.

19. The method of claim 10, wherein the security device further comprises:
   an alarm; and
   processing circuitry configured to:
      determine if the change in product presence satisfies a predetermined change threshold, and
      cause an alert by generating an audible sound via the alarm in response to the change in product presence satisfying the predetermined change threshold.

\* \* \* \* \*